United States Patent
Wu et al.

(10) Patent No.: US 12,094,554 B2
(45) Date of Patent: Sep. 17, 2024

(54) MEMORY DEVICE, FAILURE BITS DETECTOR AND FAILURE BITS DETECTION METHOD THEREOF

(71) Applicant: MACRONIX International Co., Ltd., Hsinchu (TW)

(72) Inventors: Chung-Han Wu, Kaohsiung (TW); Che-Wei Liang, Hsinchu County (TW); Chih-He Chiang, Hsinchu County (TW); Shang-Chi Yang, Changhua County (TW)

(73) Assignee: MACRONIX International Co., Ltds., Hsinchu (TW)

( * ) Notice: Subject to any disclaimer, the term of this patent is extended or adjusted under 35 U.S.C. 154(b) by 114 days.

(21) Appl. No.: 17/960,149

(22) Filed: Oct. 5, 2022

(65) Prior Publication Data
US 2024/0120018 A1 Apr. 11, 2024

(51) Int. Cl.
*G11C 29/52* (2006.01)
*G05F 3/26* (2006.01)

(52) U.S. Cl.
CPC .............. *G11C 29/52* (2013.01); *G05F 3/262* (2013.01)

(58) Field of Classification Search
CPC ................. G05F 3/262; G11C 29/52
See application file for complete search history.

(56) References Cited

U.S. PATENT DOCUMENTS

| 5,920,183 | A  | * | 7/1999 | Null | G05F 3/227 323/303 |
| 9,654,088 | B2 | * | 5/2017 | Chen | H03K 3/3565 |
| 2015/0287470 | A1 | * | 10/2015 | Yang | G11C 7/00 365/185.12 |
| 2020/0111529 | A1 |   | 4/2020 | Shin | |
| 2022/0310138 | A1 |   | 9/2022 | Okabe | |

OTHER PUBLICATIONS

"Office Action of Taiwan Counterpart Application", issued on Aug. 10, 2023, p. 1-p. 9.

* cited by examiner

*Primary Examiner* — Guy J Lamarre
(74) *Attorney, Agent, or Firm* — J.C. PATENTS

(57) ABSTRACT

A memory device, a failure bits detector, and a failure bits detection method thereof are provided. The failure bits detector includes a current generator, a current mirror, and a comparator. The current generator generates a first current according to a reference code. The current mirror mirrors the first current to generate a second current at a second end of the current mirror. The comparator compares a first voltage at a first input end with a second voltage at a second input end to generate a detection result.

19 Claims, 5 Drawing Sheets

MEMORY DEVICE, FAILURE BITS DETECTOR AND FAILURE BITS DETECTION METHOD THEREOF

BACKGROUND

Technical Field

The disclosure relates to a memory device, a failure bits detector, and a failure bits detection method thereof, and more particularly, to a memory device, a failure bits detector, and a failure bits detection method thereof which may reduce power consumption.

Description of Related Art

With the advancement of technology, memory devices are often constructed by stacking multiple layers of memory cells to increase the density of the memory cells. In the case of a large increase in the number of memory cells, a failure bits detection mechanism for the memory cells becomes an important element.

In the related art, a pull-down current source may be configured for each of failure bits to be detected, and the number of failure bits may be obtained by interpreting the magnitude of the pull-down current. However, when the number of memory cells increases significantly, the number of possible failure bits also increases significantly. Under an architecture of the conventional circuit, power consumption that may be generated by the failure bits detection mechanism also increases accordingly. The large number of pull-down current sources will also increase the load and reduce the response rate of the detection operation. If sizes of related elements are simply increased to increase the response rate, the accuracy of the detection operation may be lowered.

SUMMARY

The disclosure provides a memory device, a failure bits detector, and a failure bits detection method thereof, which may effectively reduce required power consumption.

A failure bits detector in the disclosure includes a current generator, a current mirror, and a comparator. The current generator generates a first current according to a reference code. The current mirror has a first end coupled to the current generator. The current mirror has a second end coupled to a page buffer. The current mirror mirrors the first current to generate a second current at the second end of the current mirror. The comparator has a first input end coupled to the first end of the current mirror, and a second input end of the comparator is coupled to the second end of the current mirror. The comparator compares a first voltage at the positive input end with a second voltage at the negative input end to generate a detection result.

A failure bits detection method in the disclosure includes the following steps. A first current is generated according to a reference code, and a first voltage is generated according to the first current. A current mirror is provided to mirror the first current to generate a second current and provide the second current to a page buffer to generate a second voltage. The first voltage is provided to a first input end of a comparator; the second voltage is provided to a second input end of the comparator, and a detection result is generated according to a difference between the first voltage and the second voltage.

A memory device in the disclosure includes the failure bits detector and is coupled to the page buffer.

Based on the above, in the disclosure, the first current is mirrored to generate the second current, and the second current is limited by the first current. In this way, the failure bits detector does not generate the excessive second current due to an increase of a failure bit count, and the required power consumption may be effectively saved. In addition, on the premise of not generating the excessive second current, a response rate of the failure bits detector in the disclosure may also be accelerated, thereby improving the efficiency of the failure bits detection.

DETAILED DESCRIPTION OF DISCLOSED EMBODIMENTS

Figure 1A:
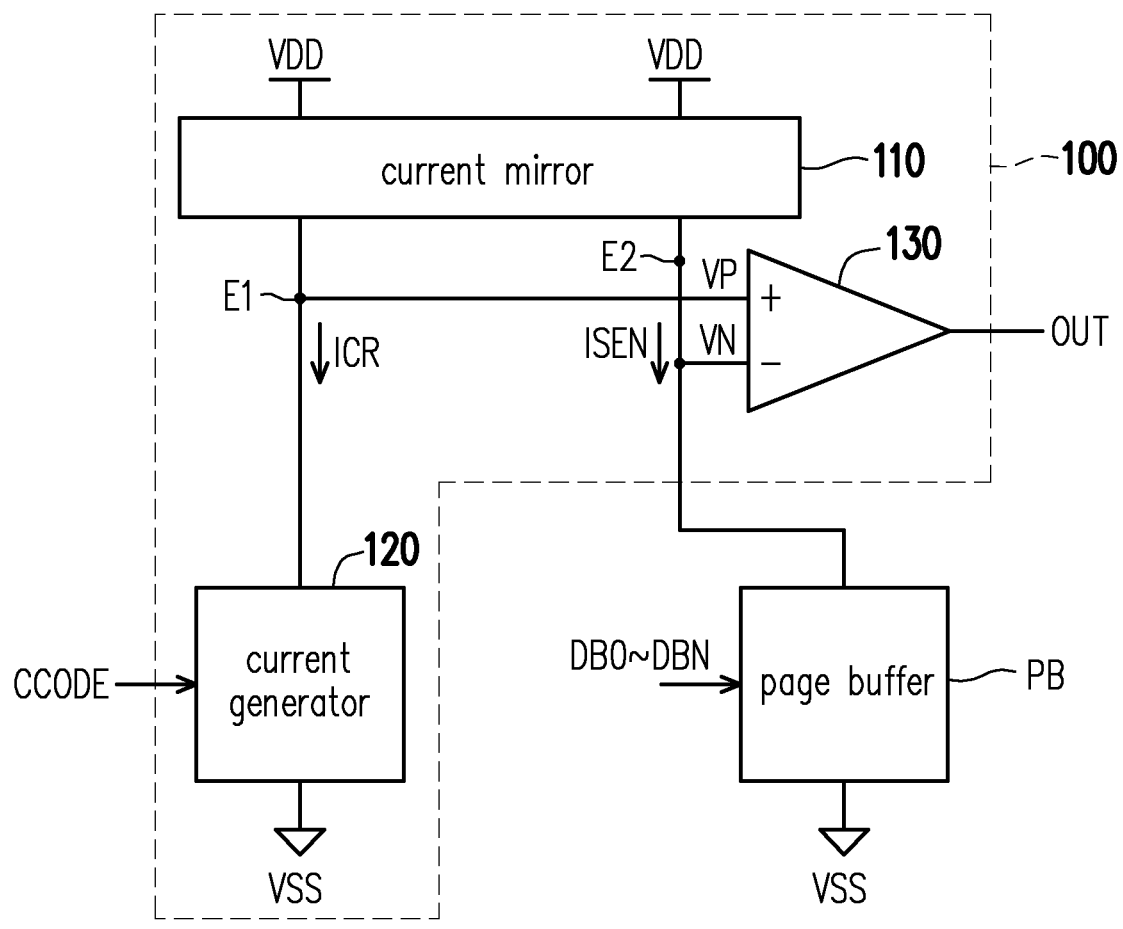
FIG. 1A is a schematic diagram of a failure bits detector according to an embodiment of the disclosure.

Referring to FIG. 1A, FIG. 1A is a schematic diagram of a failure bits detector according to an embodiment of the disclosure. A failure bits detector 100 includes a current mirror 110, a current generator 120, and a comparator 130. The current mirror 110 receives a supply voltage VDD. The current mirror 110 has a first end E1 coupled to the current generator 120, and the current mirror 110 further has a second end E2 coupled to a page buffer PB. In this embodiment, the failure bits detector 100 is suitable for a memory device 101.

The current generator 120 is coupled between the first end E1 of the current mirror 110 and a reference ground end VSS. The current generator 120 receives a reference code CCODE, and generates a first current ICR at the first end E1 of the current mirror 110 according to the reference code CCODE.

In this embodiment, the current mirror 110 mirrors the first current ICR to generate a second current ISEN at the second end E2 the current mirror 110. Since the second end E2 of the current mirror 110 is coupled to the page buffer PB, the current mirror 110 may provide the second current ISEN to the page buffer PB through the second end E2.

In addition, a positive input end of the comparator 130 is coupled to the first end E1 of the current mirror 110, and a negative input end of the comparator 130 is coupled to the second end E2 of the current mirror 110. The comparator 130 compares a voltage VP at the first end E1 of the current mirror 110 with a voltage VN at the second end E2 of the current mirror 110 to generate a detection result OUT.

In this embodiment, the page buffer PB is coupled between the second end E2 of the current mirror 110 and the reference ground end VSS. The page buffer PB may receive multiple failure bits information DB0 to DBN. The failure bits information DB0 to DBN may represent a failure bit count (FBC) in a memory block. The page buffer PB may provide a reference load according to the failure bits information DB0 to DBN. That is to say, the page buffer PB may adjust a magnitude of the voltage VN at the second end E2 of the current mirror 110 according to a level of the failure bit count represented by the failure bits information DB0 to DBN. Correspondingly, the comparator 130 may generate the detection result OUT of the failure bit count according to a comparison result of the voltages VP and VN.

In this embodiment, the failure bits information DB0 to DBN may be provided by a sense amplifier of the memory device 101, and may be temporarily stored in the page buffer PB.

Here, note that in this embodiment, the current mirror 110 may provide a mirror ratio equal to 1, for example, and perform a mirroring operation on the first current ICR, thereby generating the second current ISEN. That is to say, a magnitude of the second current ISEN may be limited by a current value of the first current ICR, the second current ISEN is not larger than the current value of the first current ICR, and is not directly related to the failure bit count. That is to say, power consumption of the failure bits detector 100 in this embodiment may be effectively controlled, so as not to generate excessive power waste.

Incidentally, the voltage VP in this embodiment may be generated according to the first current ICR. The first current ICR is provided by the current generator 120 according to the reference code CCODE. The reference code CCODE may be a digital code of multiple bits, and may be provided by an external logic signal register. The reference code CCODE may be set by a user, may be set according to the objective failure bit count to be detected, and is not necessarily a fixed value. For example, when the objective failure bit count is 5, the four bits of the reference code CCODE may be set as 0, 1, 0, and 1, respectively. In addition, when the failure bits information DB0 to DBN indicates that the failure bit count is greater than 5, the failure bits detector 100 may generate the detection result OUT equal to a logic value of 1.

Figure 1B:
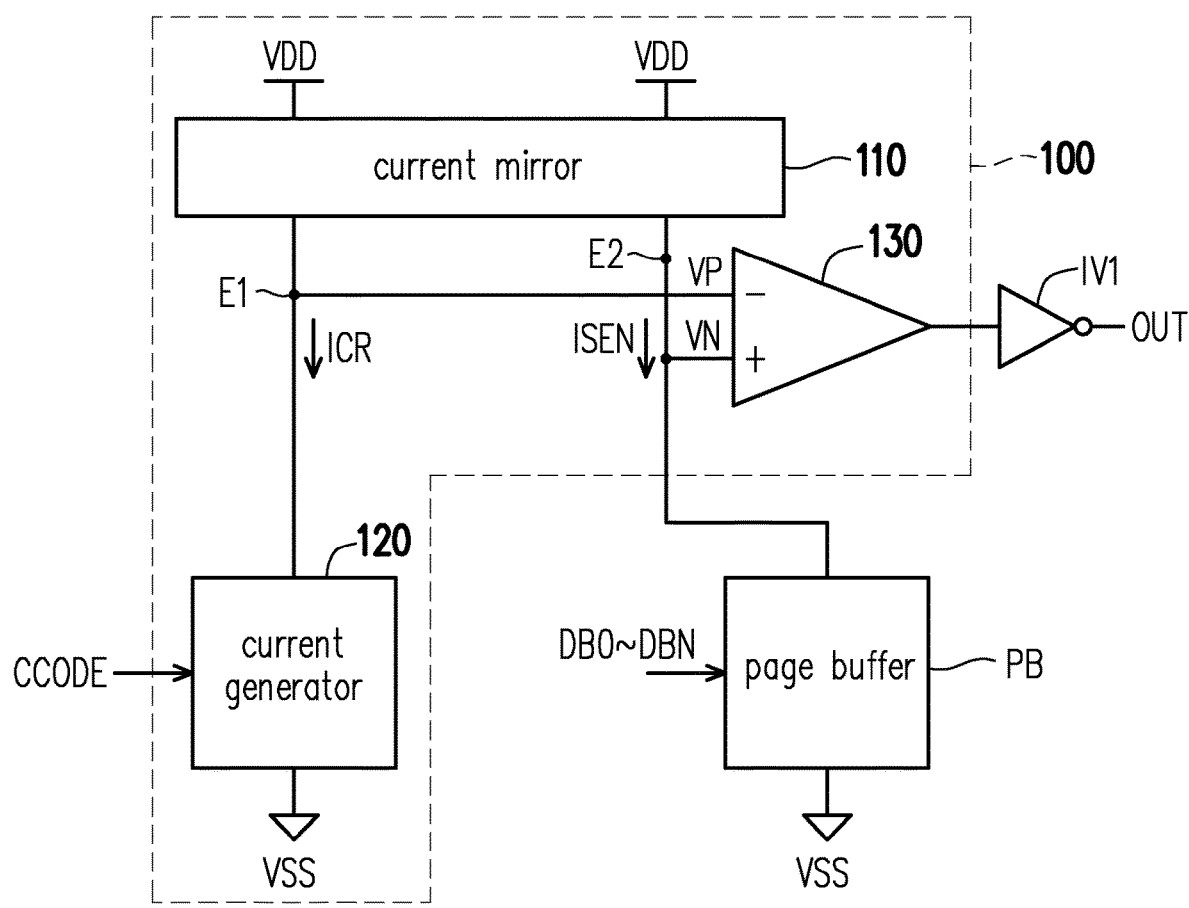
FIG. 1B is a schematic diagram of a failure bits detector according to another embodiment of the disclosure.

Referring to FIG. 1B, FIG. 1B is a schematic diagram of a failure bits detector according to another embodiment of the disclosure. In FIG. 1B, different from the embodiment of FIG. 1A, the negative input end of the comparator 130 may be coupled to the first end E1 of the current mirror 110, and the positive input end of the comparator 130 may be coupled to the second end E2 of the current mirror 110. Besides, the output end of the comparator 130 may be coupled to an inverter IV1. The inverter IV1 is used to generate the detection result OUT by inverting an output signal of the comparator 130. Such as that, the error bit detector 100 in FIG. 1B and the error bit detector 100 in FIG. 1A can generate the same detection result OUT.

Figure 2:
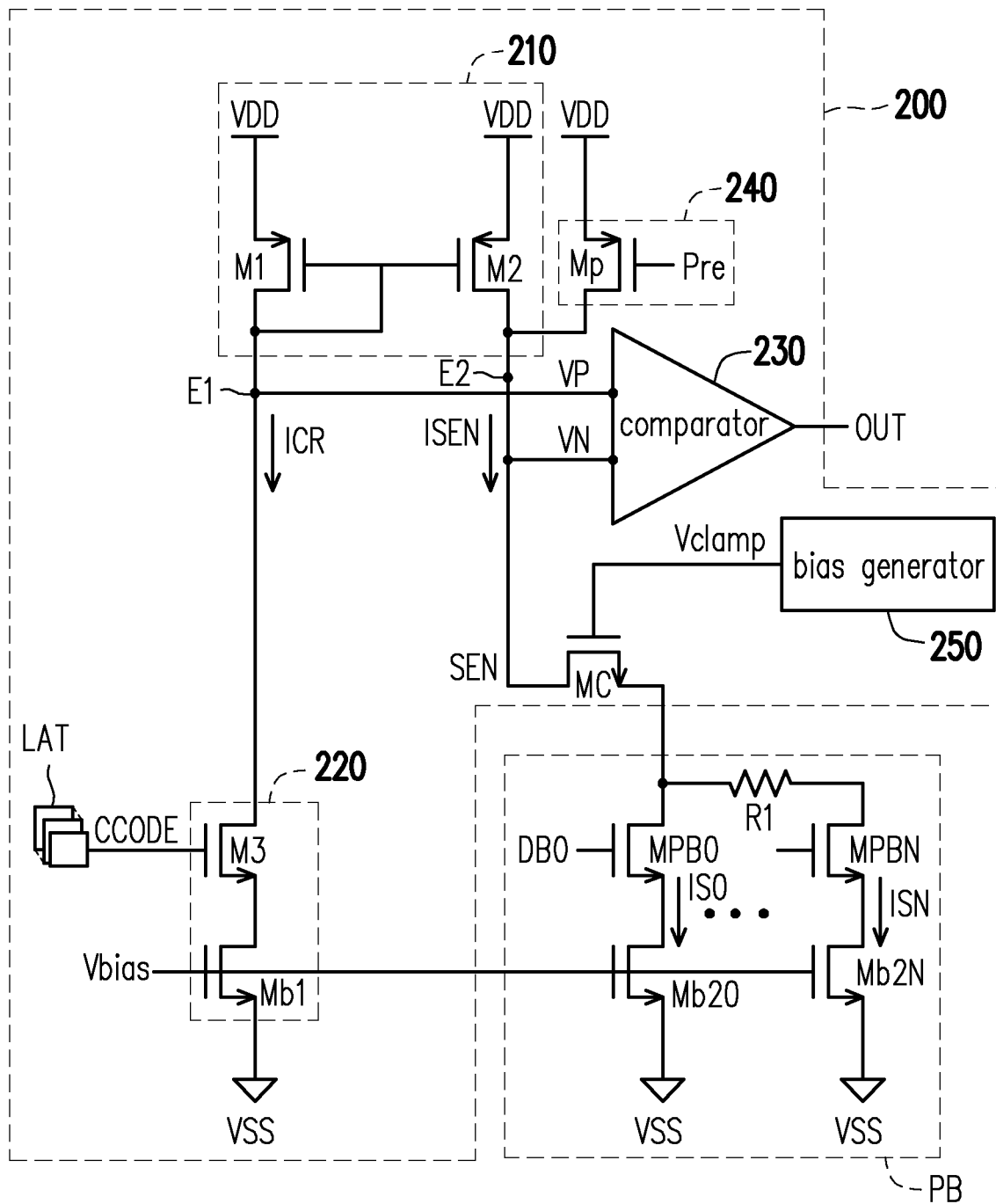
FIG. 2 is a schematic diagram of a memory device according to an embodiment of the disclosure.

Hereinafter, referring to FIG. 2, FIG. 2 is a schematic diagram of a memory device according to an embodiment of the disclosure. A memory device 201 includes a failure bits detector 200 and the page buffer PB. The failure bits detector 200 includes a current mirror 210, a current generator 220, a comparator 230, a precharge circuit 240, a bias generator 250, and a transistor MC. The current mirror 210 has the first end E1 and the second end E2. The current mirror 210 is coupled to the current generator 220 through the first end E1, and the current mirror 210 is coupled to the page buffer PB through the second end E2. A first input end of the comparator 230 is coupled to the first end E1 of the current mirror 210, and a second input end of the comparator 230 is coupled to the second end E2 of the current mirror 210. Wherein, the first input end of the comparator 230 may be a positive input end, and the second input end of the comparator 230 may be a negative input end.

In this embodiment, the current generator 220 includes a transistor M3 and a transistor Mb1. A first end of the transistor M3 is coupled to the first end of the current mirror 210, and a second end of the transistor M3 is coupled to a first end of the transistor Mb1. The transistor Mb1 is coupled between the transistor M3 and the reference ground end VSS. A control end of the transistor M3 receives the reference code CCODE, and a control end of the transistor Mb1 receives a bias voltage Vbias. The transistor M3 generates the first current ICR according to the reference code CCODE.

Here, note that the number of transistors M3 in this embodiment may be the same as the number of bits of the reference code CCODE, which may be one or more. The transistor M3 may be constructed using a long-channel transistor. The reference code CCODE may come from one or more digital registers or latches LAT. The reference code CCODE may be dynamically adjusted according to actual requirements.

In addition, in this embodiment, the page buffer PB includes multiple transistors MPB0 to MPBN and Mb20 to Mb2N. The transistors MPB0 to MPBN are connected in series with the transistors Mb20 to Mb2N respectively to form multiple transistor strings. The transistor strings are coupled in parallel between the transistor MC and the reference ground end VSS through a wire-wound resistance R1. Control ends of the transistors MPB0 to MPBN respectively receive the failure bits information DB0 to DBN, and control ends of transistors Mb20 to Mb2N collectively receive the bias voltage Vbias.

In this embodiment, taking the transistor MPB0 as an example, when the failure bits information DB0 corresponding to the transistor MPB0 is represented as a failure bit, the transistor MPB0 may be turned on according to the failure bits information DB0, and may provide a pull-down current ISO, so as to reduce a reference resistance provided by the page buffer PB. That is to say, when the failure bit count represented by the failure bits information DB0 to DBN exceeds a certain number, the reference resistance provided by the page buffer PB may be reduced to a certain value. In this way, the comparator 230 may have a comparison that the voltage VP is greater than the voltage VN, and may generate the detection result OUT of the logic value of 1.

In this embodiment, number of transistors MPB0 to MPBN is not limited.

In addition, in this embodiment, by disposing the transistor MC between the page buffer PB and the second end E2 of the current mirror 210, an isolation effect may be generated between the page buffer PB with a relatively large load and the current mirror 210. In this embodiment, a control end of the transistor MC receives a bias voltage Vclamp. The bias voltage Vclamp is provided by the bias generator 250, and the bias voltage Vclamp may be smaller than the supply voltage VDD received by the current mirror 210.

In addition, the precharge circuit 240 is coupled to the second end E2 of the current mirror 210. Based on the supply voltage VDD, the precharge circuit 240 precharges the second end E2 of the current mirror 210 during a precharge period according to a precharge signal Pre. The precharge period may occur in an initial time interval of a failure bits detection operation of the failure bits detector 200, and the voltage VN may be quickly pulled up to be equal to the supply voltage VDD. The precharge circuit 240 may be constructed by a transistor Mp. One end of the transistor Mp receives the supply voltage VDD, and the other end of the transistor Mp is coupled to the second end E2 of the current mirror 210. A control end of the transistor Mp receives the precharge signal Pre. When the precharge signal Pre is a logic value of 0, the transistor Mp may be turned on, and a voltage at the second end E2 of the current mirror 210 is pulled up to the supply voltage VDD. Correspondingly, during the precharge period, the comparator 230 may generate the detection result OUT of the logic value of 0.

Incidentally, in this embodiment, the current mirror 210 includes the transistors M1 and M2. A first end of the transistor M1 receives the supply voltage VDD, and a control end of the transistor M1 is coupled to a second end and coupled to a control end of the transistor M2. The second end of the transistor M1 is the first end E1 of the current mirror 210. A first end of the transistor M2 receives the supply voltage VDD, and a second end of the transistor M2 is the second end E2 of the current mirror 210.

The comparator 230 in this embodiment may be implemented using an operational amplifier, and the bias generator 250 may be a band gap voltage generator or a low drop-out (LDO) voltage generator. Hardware architectures thereof are both well known to those skilled in the art, and thus the same details will not be repeated in the following.

Figure 3A:
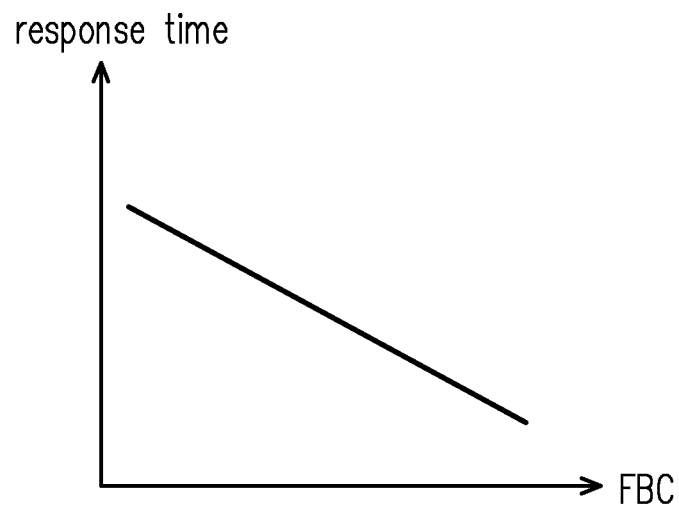
FIG. 3A is a diagram of a relationship between a failure bit count and a detection response time according to the embodiment of the disclosure.
Figure 3B:
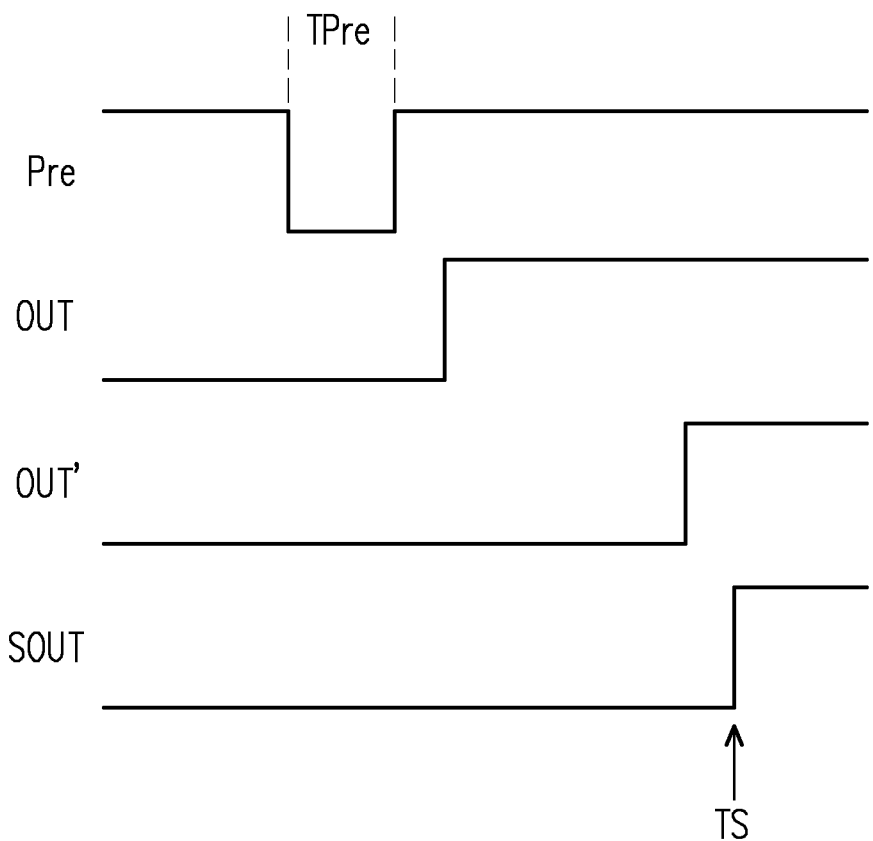
FIG. 3B is a schematic diagram of a time point of capturing a detection result of a failure bits detector according to the embodiment of the disclosure.

Hereinafter, referring to FIGS. 3A and 3B, FIG. 3A is a diagram of a relationship between a failure bit count and a detection response time according to the embodiment of the disclosure. FIG. 3B is a schematic diagram of a time point of capturing a detection result of a failure bits detector according to the embodiment of the disclosure. Referring to FIG. 2 at the same time, in FIG. 3A, in the failure bits detector in the embodiment of the disclosure, if the reference code is set to be equal to 1, it indicates whether a failure bit count FBC to be detected is greater than 1. At this time, the greater the actual failure bit count it is, the more the transistors MPB0 to MPBN are turned on, resulting in a faster rate of pulling up the detection result OUT (the shorter the response time). On the contrary, the less the actual failure bit count it is, the less the transistors MPB0 to MPBN are turned on, resulting in a slower rate of pulling up the detection result OUT' (the longer the response time).

Based on the illustration in FIG. 3A, in FIG. 3B, in a precharge time interval TPre, the precharge signal Pre is pulled low to perform a precharge operation. After the precharge time interval TPre ends, the detection operation of the failure bit count may be started. The failure bits detector 200 may generate a detection result OUT or OUT' corresponding to different response times generated by different actual failure bit counts. In order to ensure accuracy of the outputted detection result, the failure bits detector 200 may, based on a response time of the failure bits detector when the reference code (such as the reference code CCODE in FIG. 2) is a minimum value and a difference between the failure bits information and the reference code is minimum, determine a data output time point TS to output the detection result OUT or OUT' to a next circuit (such as a flip flop circuit) to obtain an output detection signal SOUT.

Figure 4:
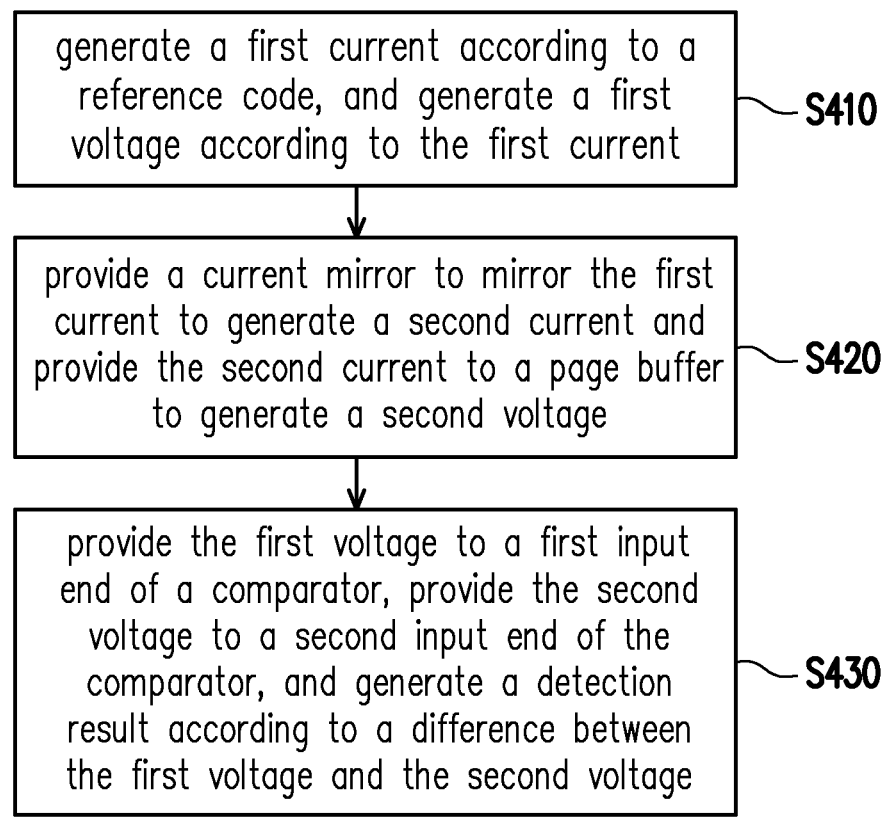
FIG. 4 is a flowchart of a failure bits detection method according to the embodiment of the disclosure.

Hereinafter, referring to FIG. 4, FIG. 4 is a flowchart of a failure bits detection method according to the embodiment of the disclosure. In step S410, a first current is generated according to a reference code, and a first voltage is generated according to the first current. In step S420, a current mirror is provided to mirror the first current to generate a second current and provide the second current to a page buffer to generate a second voltage. In step S430, the first voltage is provided to a first input end of a comparator; the second voltage is provided to a second input end of the comparator, and a detection result is generated according to a difference between the first voltage and the second voltage.

Implementation details of the above steps have been described in detail in the foregoing embodiments, and thus the same details will not be repeated in the following.

Based on the above, the failure bits detector in the disclosure generates the second current by mirroring the set first current through the current mirror. The second voltage is generated by the second current matched with the reference load generated by the page buffer according to the failure bit count. The failure bits detector in the disclosure further compares the first voltage with the second voltage generated according to the first current to generate the detection result. Since the second current is generated by mirroring the first current, the second current may be limited by the first current and be independent of the failure bit count. Therefore, the failure bits detector in the disclosure may effectively save the power consumption generated during the process of the failure bits detection, so as to achieve a purpose of energy saving and carbon reduction.

What is claimed is:

1. A failure bits detector, comprising:
a current generator generating a first current according to a reference code;
a current mirror having a first end coupled to the current generator and a second end coupled to a page buffer, and mirroring the first current to generate a second current at the second end of the current mirror; and
a comparator having a first input end coupled to the first end of the current mirror and a second input end coupled to the second end of the current mirror, and comparing a first voltage at the first input end with a second voltage at the second input end to generate a detection result,
wherein the current generator comprises:
at least one first transistor having a first end coupled to the first end of the current mirror and a control end receiving the reference code; and
a second transistor coupled between a second end of the at least one first transistor and a reference ground end, and controlled by a bias voltage.

2. The failure bits detector according to claim 1, wherein the second current is not larger than the first current.

3. The failure bits detector according to claim 1, further comprising:
a precharge circuit coupled to the second end of the current mirror, and precharging the second end of the current mirror according to a supply voltage during a precharge period.

4. The failure bits detector according to claim 1, further comprising:
a transistor coupled to a coupling path between the page buffer and the second end of the current mirror, and controlled by a bias voltage.

5. The failure bits detector according to claim 4, further comprising:
a bias voltage generator coupled to a control end of the transistor to generate the bias voltage, wherein the bias voltage is smaller than a supply voltage received by the current mirror.

6. The failure bits detector according to claim 1, wherein the page buffer receives a plurality of failure bits information, and provides a reference load between the second end of the current mirror and a reference ground end according to the plurality of failure bits information.

7. The failure bits detector according to claim 6, wherein the failure bits detector outputs the detection result based on a response time of the failure bits detector when the reference code is a minimum value and a difference between the failure bits information and the reference code is minimum.

8. The failure bits detector according to claim 1, wherein a current mirror ratio of the current mirror is equal to 1.

9. The failure bits detector according to claim 1, wherein the at least one first transistor is a long-channel transistor.

10. A failure bits detection method, comprising:
generating a first current according to a reference code by a current generator, and generating a first voltage according to the first current;
providing a current mirror to mirror the first current to generate a second current and provide the second current to a page buffer to generate a second voltage; and
providing the first voltage to a first input end of a comparator, providing the second voltage to a second input end of the comparator, and generating a detection result according to a difference between the first voltage and the second voltage,
wherein the current generator comprises:
at least one first transistor having a first end coupled to the first end of the current mirror and a control end receiving the reference code; and
a second transistor coupled between a second end of the at least one first transistor and a reference ground end, and controlled by a bias voltage.

11. The failure bits detection method according to claim 10, wherein the second current is not larger than the first current.

12. The failure bits detection method according to claim 10, further comprising:
during a precharge period, precharging an end point of the current mirror that generates the second voltage according to a supply voltage.

13. The failure bits detection method according to claim 10, wherein providing the second current to the page buffer to generate the second voltage comprises:
receiving, by the page buffer, a plurality of failure bits information;
providing, by the page buffer, a reference load between a second end of the current mirror and a reference ground end according to the plurality of failure bits information; and
generating the second voltage according to the reference load and the second current.

14. The failure bits detection method according to claim 13, further comprising:
outputting the detection result based on a response time of the failure bits detector when the reference code is a minimum value and a difference between the failure bits information and the reference code is minimum.

15. The failure bits detection method according to claim 10, wherein providing the current mirror to mirror the first current to generate the second current comprises:
providing the current mirror to mirror the first current to generate the second current.

16. A memory device, comprising:
a page buffer; and
a failure bits detector, comprising:
a current generator generating a first current according to a reference code;
a current mirror having a first end coupled to the current generator and a second end coupled to the page buffer, and mirroring the first current to generate a second current at the second end of the current mirror; and
a comparator having a first input end coupled to the first end of the current mirror and a second input end coupled to the second end of the current mirror, and comparing a first voltage at the first input end with a second voltage at the second input end to generate a detection result,
wherein the current generator comprises:
at least one first transistor having a first end coupled to the first end of the current mirror and a control end receiving the reference code; and
a second transistor coupled between a second end of the at least one first transistor and a reference ground end, and controlled by a bias voltage.

17. The memory device according to claim 16, wherein the second current is not larger than the first current.

18. The memory device according to claim 16, wherein the page buffer receives a plurality of failure bits information, and provides a reference load between the second end of the current mirror and a reference ground end according to the plurality of failure bits information.

19. The memory device according to claim 16, wherein a current mirror ratio of the current mirror is equal to 1.

* * * * *